US010749605B2

(12) United States Patent
Redman-White et al.

(10) Patent No.: US 10,749,605 B2
(45) Date of Patent: *Aug. 18, 2020

(54) LASER POWER CONTROLLER

(71) Applicant: HiLight Semiconductor Limited, Southampton, Hampshire (GB)

(72) Inventors: William Redman-White, Southampton (GB); Dominique Coue, Southampton (GB); Colin Whitfield, Southampton (GB)

(73) Assignee: HiLight Semiconductor Limited, Hampshire (GB)

( * ) Notice: Subject to any disclaimer, the term of this patent is extended or adjusted under 35 U.S.C. 154(b) by 0 days.

This patent is subject to a terminal disclaimer.

(21) Appl. No.: 16/180,846

(22) Filed: Nov. 5, 2018

(65) Prior Publication Data

US 2019/0089464 A1 Mar. 21, 2019

Related U.S. Application Data

(63) Continuation-in-part of application No. 15/643,958, filed on Jul. 7, 2017, now Pat. No. 10,205,532.

(30) Foreign Application Priority Data

Jul. 8, 2016 (GB) .................................. 1611938.0
Jan. 12, 2018 (GB) .................................. 1800531.4

(51) Int. Cl.
*H04B 10/564* (2013.01)
*H01S 5/0683* (2006.01)
(Continued)

(52) U.S. Cl.
CPC ......... *H04B 10/564* (2013.01); *H01S 3/1306* (2013.01); *H01S 5/0428* (2013.01);
(Continued)

(58) Field of Classification Search
CPC ... H04B 10/564; H04B 10/504; H01S 5/0427; H01S 5/0428; H01S 5/06253; H01S 5/06216; H01S 5/06835; H01S 5/0683
See application file for complete search history.

(56) References Cited

U.S. PATENT DOCUMENTS 4,612,671 A 9/1986 Giles
4,709,416 A * 11/1987 Patterson ............. H04B 10/564
398/197
(Continued)

FOREIGN PATENT DOCUMENTS

GB 1 539 624 A 1/1979
GB 1539624 A * 1/1979 ......... H01S 5/06832
(Continued)

OTHER PUBLICATIONS

Combined Search and Examination Report dated Aug. 16, 2016, in United Kingdom Patent Application No. GB1611938.0, 5 pages.
(Continued)

*Primary Examiner* — Joshua King
(74) *Attorney, Agent, or Firm* — Squire Patton Boggs (US) LLP

(57) ABSTRACT

A system for transmitting a sequence of at least two data bursts in a fibre optical communications system includes: selection circuitry configured to select one of a data input value, a logical high value or a logical low value such that the selection circuitry selects the data input value during a data transmission period during a defined burst period and selects one of the logical high value and the logical low value during an extension time period during the defined burst period and immediately following the data transmission period, such that for the sequence of at least two bursts, at least one burst has a logical low value extension period
(Continued)

and at least one burst has a logical high value extension period; drive circuitry configured to apply a current to a laser diode, the current corresponding to the value selected by the selection circuitry during the defined burst period or a zero value otherwise, the current being such that the laser diode is configured to provide an optical output; an optical sensor module configured to provide a sensor module output corresponding to the optical output of the laser diode; wherein the sensor module output is configured to provide an electrical output proportional to the laser diode's optical output corresponding to the logical high value and the logical low value in the sequence of at least two bursts, and further configured to provide an output corresponding to an average value of the sensor module output during only the data transmission period during the sequence of bursts; and a controller configured to receive values regarding desired minimum and maximum optical output power levels of the laser diode and to receive the electrical output from the optical sensor module proportional to the optical output power level corresponding to the logical high and the logical low values, and to receive the output corresponding to the average value of the sensor module output during only the data transmission period during the sequence of bursts; wherein the controller is configured to use the received information to provide control values for the drive circuitry.

19 Claims, 11 Drawing Sheets

(51) Int. Cl.
| | |
|---|---|
| H04B 10/50 | (2013.01) |
| H01S 3/13 | (2006.01) |
| H01S 5/042 | (2006.01) |
| H01S 5/06 | (2006.01) |
| H01S 5/062 | (2006.01) |

(52) U.S. Cl.
CPC ...... H01S 5/06832 (2013.01); H01S 5/06835 (2013.01); H04B 10/503 (2013.01); H04B 10/50575 (2013.01); H01S 5/0617 (2013.01); H01S 5/06216 (2013.01)

(56) References Cited

U.S. PATENT DOCUMENTS

| | | | |
|---|---|---|---|
| 5,502,298 A | 3/1996 | Geller | |
| 5,710,787 A | 1/1998 | Amada et al. | |
| 5,850,409 A * | 12/1998 | Link | H01S 5/06832 372/38.01 |
| 6,219,165 B1 * | 4/2001 | Ota | H04B 10/695 398/197 |
| 6,370,175 B1 * | 4/2002 | Ikeda | H04N 1/40037 347/236 |
| 7,792,166 B2 | 9/2010 | Borschowa | |
| 8,971,364 B2 * | 3/2015 | Hoffman | H01S 5/06808 372/38.01 |
| 9,478,931 B2 * | 10/2016 | Burkholder | H01S 3/1317 |
| 10,205,532 B2 * | 2/2019 | Redman-White | H01S 5/06832 |
| 2003/0035451 A1 * | 2/2003 | Ishida | H01S 5/042 372/38.02 |
| 2003/0091076 A1 * | 5/2003 | Fischer | H01S 5/042 372/38.02 |
| 2003/0174744 A1 * | 9/2003 | Reilly | H01S 5/042 372/32 |
| 2004/0109696 A1 * | 6/2004 | Toshihisa | H04B 10/503 398/198 |
| 2005/0105569 A1 * | 5/2005 | Senga | G11B 7/126 372/29.021 |
| 2005/0271099 A1 * | 12/2005 | Miremadi | H01S 5/06832 372/38.02 |
| 2006/0108501 A1 * | 5/2006 | Draper | H01S 5/06804 250/205 |
| 2007/0286609 A1 * | 12/2007 | Ikram | H04B 10/564 398/197 |
| 2008/0084904 A1 | 4/2008 | Hayashi | |
| 2011/0019705 A1 * | 1/2011 | Adams | B23K 26/0622 372/25 |
| 2011/0033193 A1 * | 2/2011 | Nakamura | G02F 1/0123 398/183 |
| 2012/0051379 A1 * | 3/2012 | Wang | H01S 5/042 372/38.01 |
| 2012/0106953 A1 | 5/2012 | Nguyen et al. | |
| 2014/0270752 A1 * | 9/2014 | Onaka | H04B 10/0779 398/23 |
| 2014/0314112 A1 * | 10/2014 | Budai | H01S 5/0261 372/38.02 |
| 2015/0188627 A1 * | 7/2015 | Yuda | H04B 10/502 398/30 |

FOREIGN PATENT DOCUMENTS

| | | | |
|---|---|---|---|
| GB | 2 187 056 A | 8/1987 | |
| GB | 2 535 553 A | 8/2016 | |
| GB | 2 541 291 B | 2/2017 | |
| JP | H01-98284 A | 4/1989 | |
| JP | 2005123350 A * | 5/2005 | ............ H01S 5/042 |
| WO | WO 93/13577 A1 | 7/1993 | |

OTHER PUBLICATIONS

International Search Report and Written Opinion dated Sep. 11, 2017, in International Patent Application No. PCT/EP2017/067090, 11 pages.

Examination Report dated Sep. 28, 2017, in United Kingdom Patent Application No. GB1611938.0, 4 pages.

Combined Search and Examination Report dated Feb. 28, 2018, in United Kingdom Patent Application No. GB1800531.4, 9 pages.

* cited by examiner

Prior Art

LASER POWER CONTROLLER

CROSS-REFERENCE TO RELATED APPLICATIONS

The present application is a continuation-in-part of U.S. application Ser. No. 15/643,958, filed Jul. 7, 2017.

FIELD OF THE INVENTION

Some embodiments relate to an apparatus for controlling optical output power levels of the laser diode and in particular but not exclusively to an apparatus for controlling optical output power levels of the laser diode in a fibre optical communications system.

BACKGROUND OF THE INVENTION

In a fibre optical communications system, it is important to be able to control the output power of the transmitting laser diode for a number of reasons. Firstly, the average and peak power of the laser must not exceed certain limits in order to avoid damage. Secondly, the different power levels corresponding to binary (or other radix) data values must be set so that the modulation index (alternatively defined as extinction ratio) is within the overall system specifications to ensure reliable reception at the end of the link. One difficulty to be addressed in any control system is that the characteristics of the laser can change significantly with temperature and also over time with ageing, and diverging from an ideal linear response, so that a conventional factory set up of the "high" and "low" drive current levels is not adequate.

Numerous techniques exist in prior art that describe methods intended to estimate the instantaneous values of the minimum and maximum transmitted optical output and compensate for the changes in device characteristics. Most are limited in their effectiveness due to the restricted bandwidth of the monitor diode and its associated circuitry.

Monitoring the transmitted output power is even more challenging in an optical communications link that transmits the data in a series of discrete bursts, as the average value of the optical output may vary greatly, and the instantaneous levels are not stable enough for most methods described in prior art to reach adequate estimates of minimum and maximum levels. The temperature related effects are likely to be even more severe, as the transmitting laser diode may be in an off state for a long period before being activated for a data burst, and hence may have cooled to ambient temperature before heating up during a data burst.

Hence it is desirable to be able to sense the minimum and maximum optical outputs corresponding to logic "1" and logic "0" during data bursts on a near continuous basis. It is also desirable to be able to sense the average level of the optical output during data bursts. It is further desirable to be able to make such measurements using a transmit power monitoring function with only moderate bandwidth, and by means that do not disturb the transmitted data payload nor compromise the received signal to noise performance.

SUMMARY OF THE INVENTION

According to a first aspect there is provided a system for transmitting a sequence of at least two data bursts in a fibre optical communications system, the system comprising: selection circuitry configured to select one of a data input value, a logical high value or a logical low value such that the selection circuitry selects the data input value during a data transmission period during a defined burst period and selects one of the logical high value and the logical low value during an extension time period during the defined burst period and immediately following the data transmission period, such that for the sequence of at least two bursts, at least one burst has a logical low value extension period and at least one burst has a logical high value extension period; drive circuitry configured to apply a current to a laser diode, the current corresponding to the value selected by the selection circuitry during the defined burst period or a zero value otherwise, the current being such that the laser diode is configured to provide an optical output; an optical sensor module configured to provide a sensor module output corresponding to the optical output of the laser diode; wherein the sensor module output is configured to provide an electrical output proportional to the laser diode's optical output corresponding to the logical high value and the logical low value in the sequence of at least two bursts, and further configured to provide an output corresponding to an average value of the sensor module output during only the data transmission period during the sequence of bursts; and a controller configured to receive values regarding desired minimum and maximum optical output power levels of the laser diode and to receive the electrical output from the optical sensor module proportional to the optical output power level corresponding to the logical high and the logical low values, and to receive the output corresponding to the average value of the sensor module output during only the data transmission period during the sequence of bursts; wherein the controller is configured to use the received information to provide control values for the drive circuitry.

The optical sensor module may comprise a photodiode output power detector.

The optical sensor module may comprise an optical sensor and a trans-impedance amplifier, the trans-impedance amplifier being configured to provide the sensor module output.

The control values may be configured to control at least one of: an average power of the optical output of the laser diode; a power of the optical output of the laser diode representing a logical high; a power of the optical output of the laser diode representing a logical low; and a modulation index of the optical output of the laser diode.

The current may comprise a steady element and a variable element.

The drive circuitry may be configured to set the current applied to the laser diode dependent on a combination of a bias control value and a modulation control value.

The control values may be configured to control the drive circuitry to set the at least one of: a bias current and a modulation current applied to the laser diode.

The drive circuitry may comprise bias circuitry configured to provide a bias current to the laser diode.

The drive circuitry may comprise modulation circuitry configured to provide a modulation current to the laser diode.

The drive circuitry may be configured to set the current applied to the laser diode dependent on a combination of an average value and a modulation value.

The burst period may be gated by a burst enable signal.

The control values may control the drive circuitry to deliver the optical output desired values regarding desired minimum and maximum optical output power levels.

The extension time period may be greater than a settling time of the sensor module output.

The selection circuitry may be configured to alternately select one of the logical high value and logical low value for each consecutive extension time period.

The selection circuitry may be configured to select the logical high value or the logical low value for each consecutive extension time period according to a pre-defined sequence.

The selection circuitry may comprise a selector switch function.

The bandwidth of the selection circuitry may be configured to switch between the data input, the logical high value and the logical low value in a time significantly less than that of the extension time period.

The control values for the drive circuitry may be based on a combination of the average and high and low values from the optical sensor module each scaled by a coefficient.

According to a second aspect there is provided a method for transmitting a sequence of at least two data bursts in a fibre optical communications system, the method comprising: selecting one of a data input value, a logical high value or a logical low value such that the data input value is selected during a data transmission period during a defined burst period and one of the logical high value and the logical low value is selected during an extension time period during the defined burst period and immediately following the data transmission period such that for the sequence of at least two bursts, at least one burst has a logical low value extension period and at least one burst has a logical high value extension period; applying a current to a laser diode, the current corresponding to the selected value during the defined burst period or a zero value otherwise, the current being such that the laser diode is configured to provide an optical output; determining an electrical output proportional to a laser diode's optical output corresponding to the logical high value and the logical low value by using a sensor module output providing an output corresponding to an average value of the sensor module output during only the data transmission period during the sequence of bursts; receiving desired values regarding desired minimum and maximum optical output power levels of the laser diode; and providing control values for the current applied to the laser diode based on the electrical output proportional to the optical output corresponding to the logical high and the logical low value further corresponding to the average value of the sensor module output during only the data transmission period during the sequence of bursts and the received desired values.

The method may further comprise applying the control values to control at least one of: an average power of the optical output of the laser diode; a power of the optical output of the laser diode representing a logical high; a power of the optical output of the laser diode representing a logical low; and a modulation index of the optical output of the laser diode.

The current may comprise a steady element and a variable element.

The method may further comprise setting the current applied to the laser diode dependent on a combination of a bias control value and a modulation control value.

Setting the current applied to the laser diode may comprise setting at least one of a bias current and a modulation current applied to the laser diode based on the bias control value and modulation control value.

Applying the current may further comprise providing a bias current to the laser diode.

Applying the current may comprise providing a modulation current to the laser diode.

Setting the current applied to the laser diode may comprise setting the current dependent on a combination of an average value and a modulation value.

The burst period may be gated by a burst enable signal.

The method may further comprise applying the control values to deliver the desired logical high and logical low optical output power levels.

The extension time period is greater than a settling time of providing the output.

Selecting one of a data input value, a logical high value or a logical low value may comprise alternately selecting one of the logical high value and logical low value for each consecutive extension time period.

Selecting one of a data input value, a logical high value or a logical low value may comprise selecting the logical high value or the logical low value for each consecutive extension time period according to a pre-defined sequence.

Selecting one of a data input value, a logical high value or a logical low value may comprise selecting based on selector switch function.

Selecting one of a data input value, a logical high value or a logical low value may comprise switching between the data input, the logical high value and the logical low value in a time significantly less than that of the extension time period.

Using the output corresponding to the optical output of the laser diode and the desired values to provide control values for the drive circuitry may comprise providing control values based on a combination of the average and high and low values from the optical sensor module each scaled by a coefficient.

In an embodiment of the invention means are provided to measure the optical power corresponding to the maximum and minimum levels on a burst-by-burst basis using a conventional monitor photodiode channel without the need for full data bandwidth monitor. Means are provided for inserting reference level information in the transmit path in a manner compatible with and transparent to the information channel. The invention is applicable to a range of burst mode optical fibre communication systems adhering to standards such as ITU-T Recommendation G.984.2 and similar related standards.

BRIEF DESCRIPTION OF THE DRAWINGS

The invention will now be described solely by way of example and with reference to the accompanying drawings in which.

DETAILED DESCRIPTION

The description is not to be taken in a limiting sense but is made merely for the purposes of describing the general principles of the embodiments of the invention. For example, operations that are illustrated as being performed using digital signals and digital circuits may also be achieved using substantially analogue signals and analogue circuits.

Figure 1:
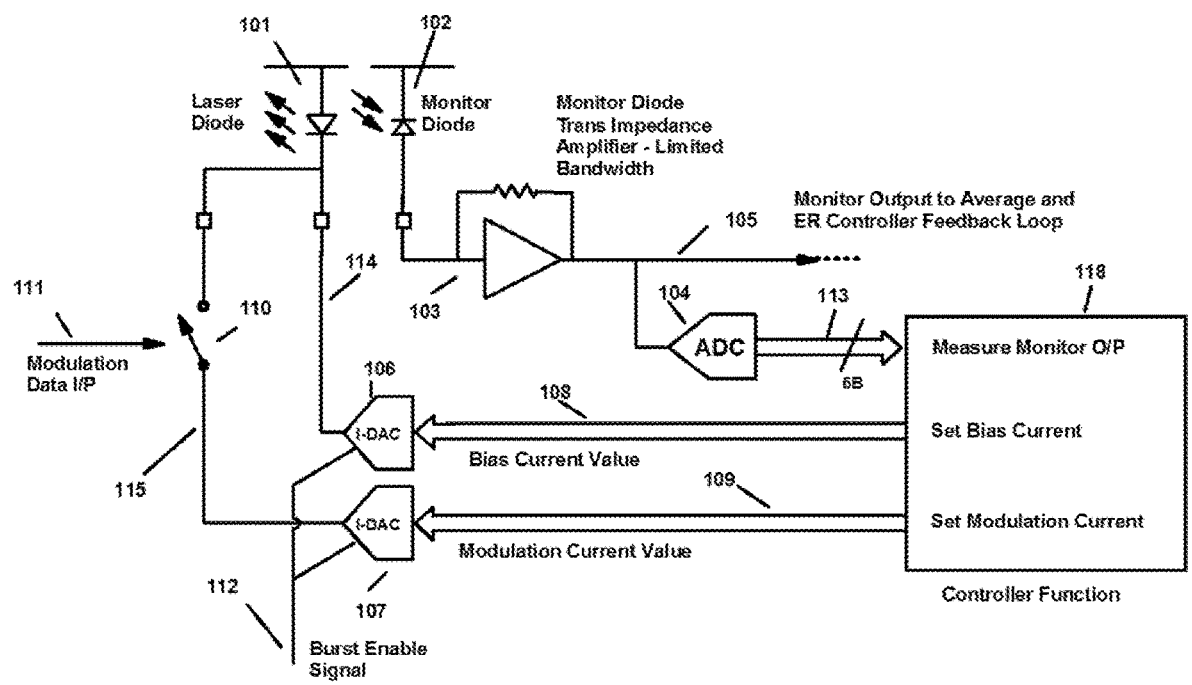
FIG. 1 shows a typical arrangement for a transmitter in a burst-mode optical fibre link.

FIG. 1 shows the typical arrangement in a transmitter suitable for an optical communications system. A laser diode 101 is provided with a current having a steady element and a variable element. This may in the form of an average current with a bi-directional modulation current adding and subtracting current to create the optical maxima and minima; or there may be a smaller steady bias current 114 with a modulation current 115 that is disconnected by means of a switching function 110 to indicate a logical low level in the modulation data input 111. The latter variant is represented in the figure. These currents may be provided by digital-to-analogue converters 106 and 107 having current outputs controlled by digital values 108 and 109 respectively that are set by the controller function 118. When operating in a burst mode, these currents may be gated in a manner corresponding to the active periods in a data burst by means of a further signal or signals 112 corresponding the length of the prescribed burst. The optical output of the laser diode 101 is sensed by a monitor photodiode 102 to create a current proportional to the sensed optical level and which may be converted to a voltage 105 with a trans-impedance amplifier 103. The combination of the monitor diode 102 and amplifier 103 typically have a bandwidth that is substantially less than that of the main data channel bandwidth. This monitor value 105 may be converted to digital form 113 by means of an analogue-to-digital converter 104 and these data used by the controller 118 to set the current levels according to some algorithm. The bandwidth limitation of the monitor channel is very significant in the implementation of any transmit optical level control mechanism since it restricts the observability of the peak and trough values of the optical signal.

Figure 2:
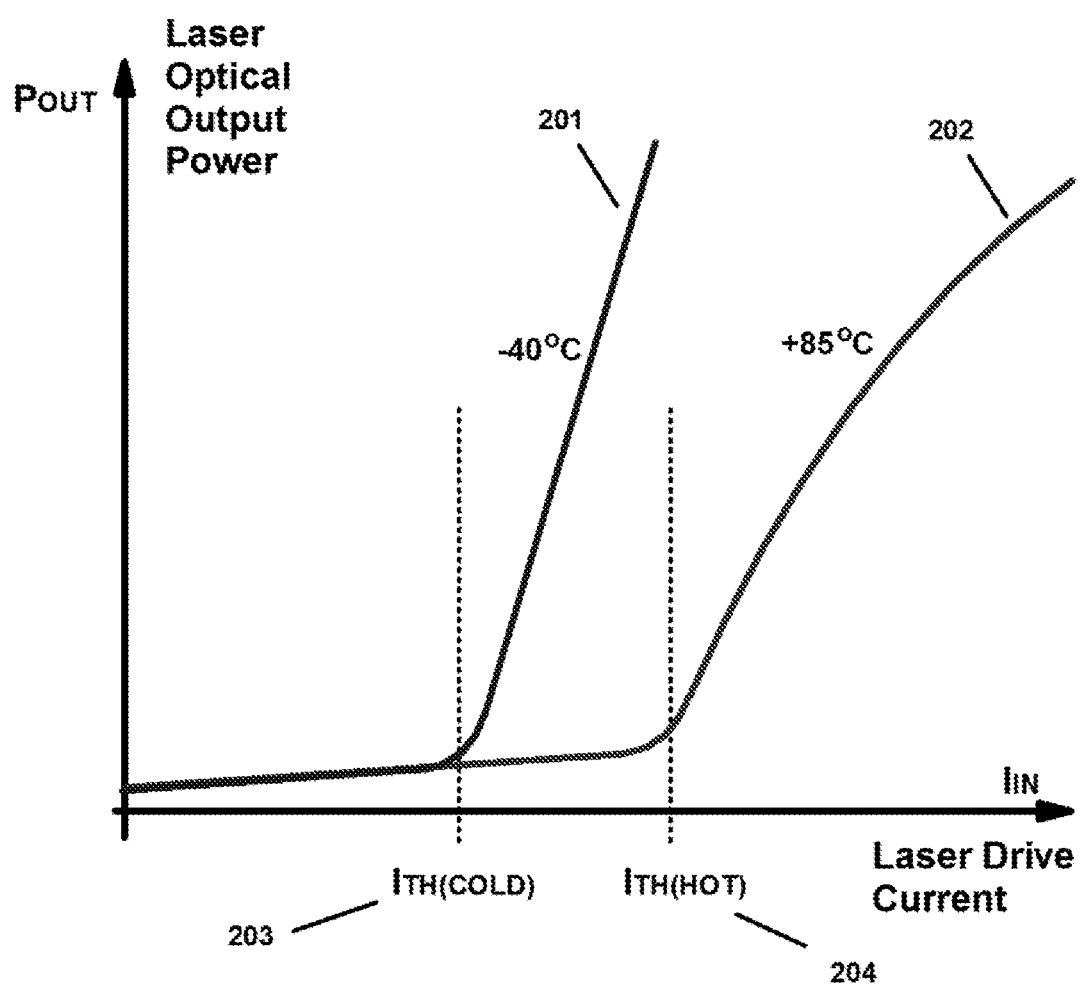
FIG. 2 shows a representation of a laser diode output characteristic and temperature effects.

FIG. 2 is a diagrammatic representation of the characteristics of a typical laser diode as is used in optical communications systems. When used to generate a modulated optical signal, the current through the laser diode is modulated such that the minimum current is above the threshold value 203, for the laser, and the maximum current is below the manufacturer's ratings for the device. When a laser diode is cold, or the current levels are relatively low, a simple linear model 201 may suffice. However, when the laser diode heats up, or as its characteristics change with age, the threshold current may change 204 and the relationship may exhibit a more curved shape 202. Thus, maintaining the desired optical output and the desired ER during operation over a system's lifetime is not considered trivial.

In any given practical system, the maximum current may be set so that the average operating power of the laser is set to a defined level with regard to the required signal level for reliable communications to be established. A critical parameter in such a system is the ratio of the maximum to minimum optical output, usually referred to as the Extinction Ratio (ER), as this affects the signal to noise levels for the receiver. The ER is a function of the minimum and maximum laser diode current values, and is sometimes represented as a simple linear relationship, but in reality this is not an accurate representation.

Figure 3:
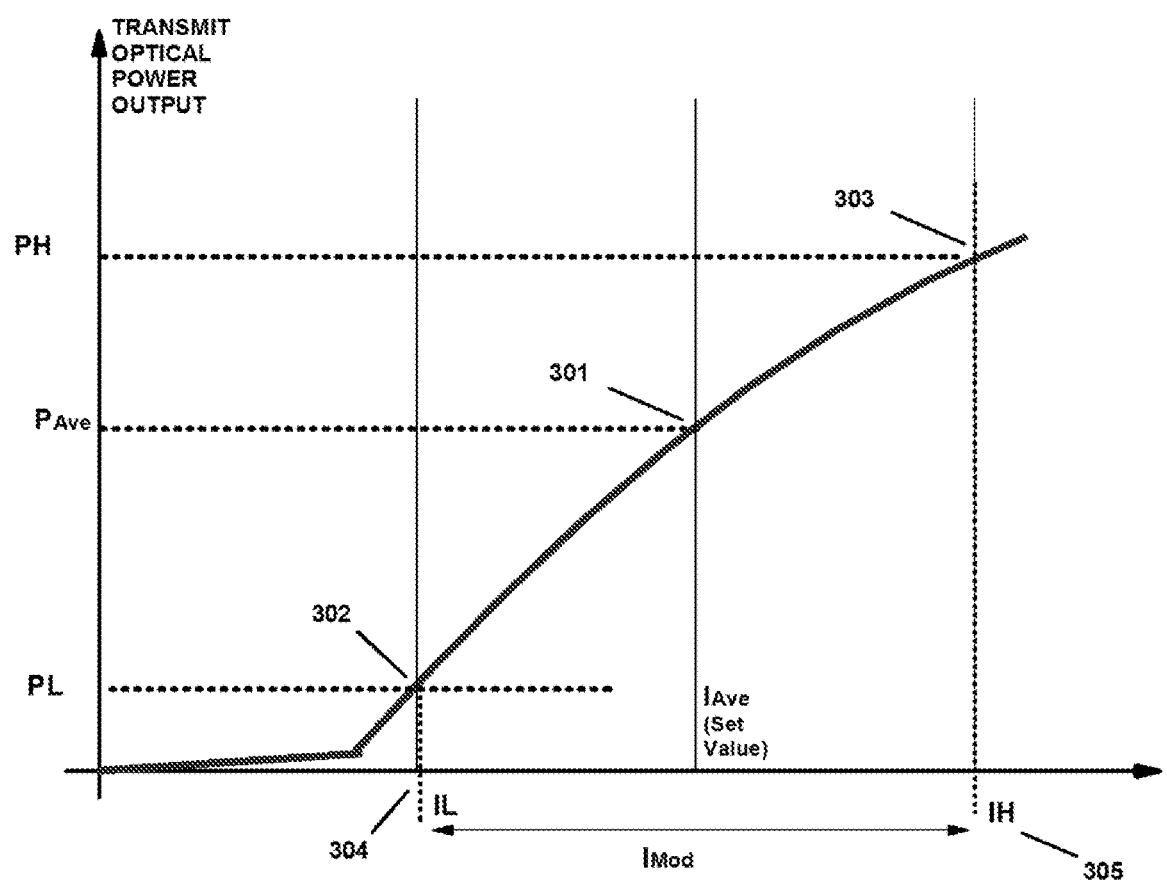
FIG. 3 shows the limitations of conventional estimation methods where there is curvature in the laser characteristic.

FIG. 3 shows how average optical power 301 of a laser diode at an elevated temperature is not suitable as the basis for an accurate estimate of the minimum 302 and maximum 303 optical levels and hence the ER. This also implies that there are problems with controlling the minimum 304 and maximum 305 current levels needed to obtain the desired average power and ER. Where a system operates with a continuous data stream, the laser can reach a steady state temperature that is relatively easy to monitor. Further, there is time to gather data from a monitor diode system to measure the peak and trough optical data levels with some kind of averaging of the measurements to provide a reliable estimate of the ER and average optical power. Systems for this purpose are known in prior art (for example, Smith et al, Electronics Letter Vol 14, 1978, and similar derivative arrangements).

Figure 4:
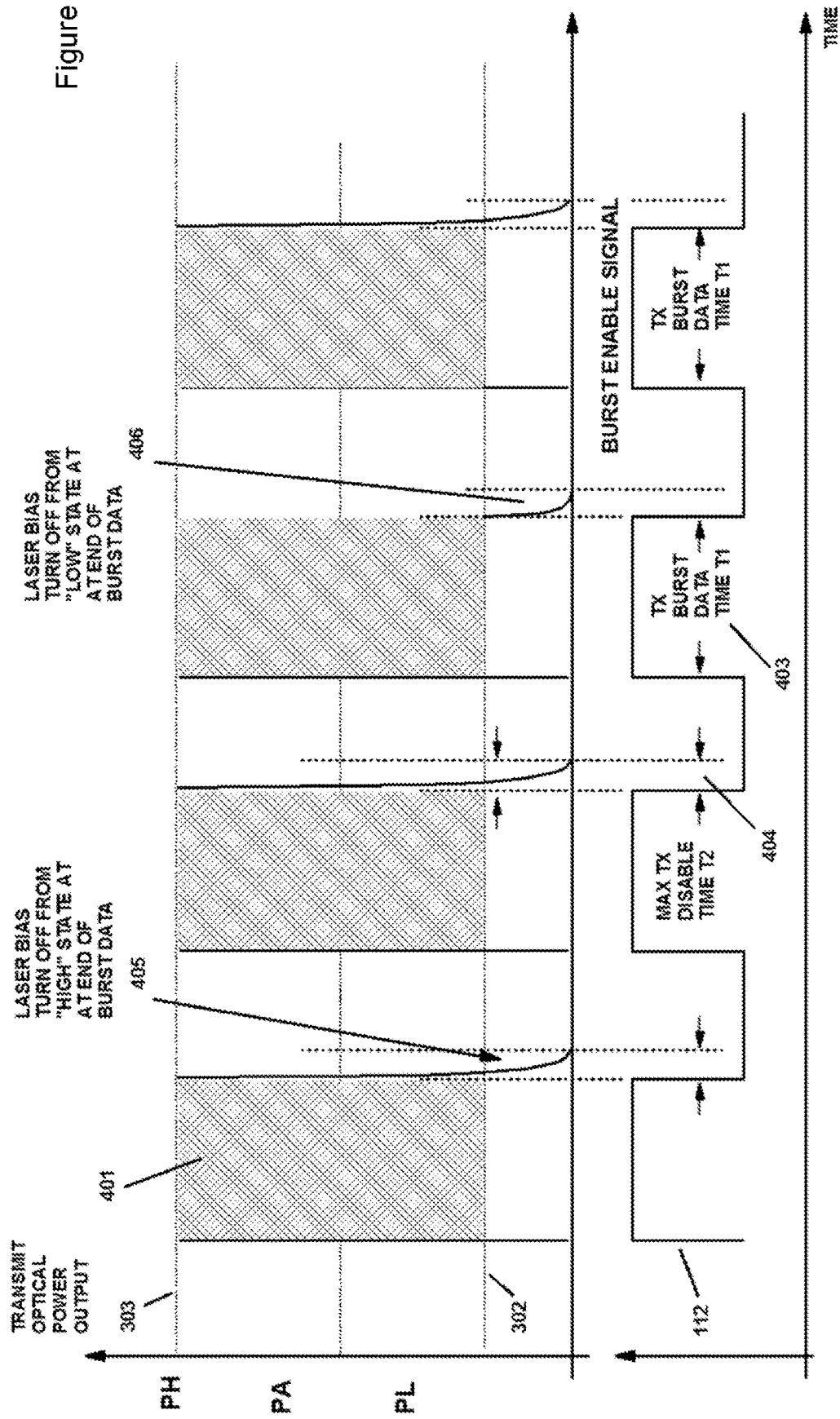
FIG. 4 shows the structure of a typical data burst with typical allowable laser turn off time.

FIG. 4 shows the general form of optical signals intended to transmit data bursts in a system adhering to specifications for burst mode operation, (such as standard ITU-T Recommendation G.984.2). The bias current to the laser is gated by a burst enable signal 112 before data signals 111 are used to modulate the laser output. In such standards the duration T1 of the data burst 403 is precisely defined, and typically of the order of a few 100 nanoseconds. Note that at the end of a data burst, the logical value may be in a high state or a low state. Such standards also typically define T2 a time interval 404 within which the laser output must return to zero. To allow for the bandwidth of practical bias control systems, this interval is of the order of 10 ns (and in the specific example of the communications cited earlier the interval is 12.8 ns).

In such a burst mode system the problem of controlling the average power and ER is difficult. Before the start of a burst the laser will be in a relatively cool state. As soon as the data packets are transmitted, the laser will begin to heat up and will continue to do so during a typical burst. It is a requirement of the standards that the system be operational after only a short number of training bursts, for example 5 or less, in which the system's operating parameters must come under control. Means for establishing the operating parameters in a timely fashion have been disclosed in UK Patent GB2535553B wherein defined amplitude trial bursts are output in order to determine the slope efficiency of the laser at the start of a train of data bursts.

There remains a requirement to provide means for accurately controlling the extinction ratio of the laser output after the initial training bursts where the laser has substantially warmed up to an elevated average temperature. Any measurement of the peak and trough values has the same monitor channel bandwidth limitations as in a continuous system, but the demands are further complicated by the intermittent nature of the signal making meaningful averaging more difficult.

In an example means are provided to make rapid and accurate estimates of the instantaneous values of the optical output representing data '1' and data '0' values, or other such values as may be defined. Using said estimates, further means are provided that are able to calculate the required values of bias current and modulation current needed to deliver the desired output levels, and to maintain these notwithstanding changes in the laser characteristics due to short term heating and/or long term ageing.

In FIG. 4 it will be noticed that the time to turn-off of the laser after a burst of data is not a constant, but depends on the logical value at the end of the burst. It will also be obvious that the bandwidth of the modulation circuit 110 in response to the modulation data signal 111 is very fast. Hence rather than use the bias current control to turn off from a High state, the modulation circuit may be used to reduce the laser output very rapidly to the Low state first, typically in a time of the order of 10s of picoseconds. Once the laser output is in said Low state, the task of turning off to full extinction becomes much easier. Further, it is not a difficult task to ensure that the bias current 114 responds to the burst enable signal 112 or a substantially equivalent signal in a time interval substantially less than the interval 404 required by the standard. This approach makes available a time interval that while not large is nonetheless greater than the transient settling time typical of such monitor channel circuits. Using this knowledge it is possible to exploit time available in the specified turn off interval 404 to execute valuable measurements of the prevailing optical High and Low output levels.

Figure 5:
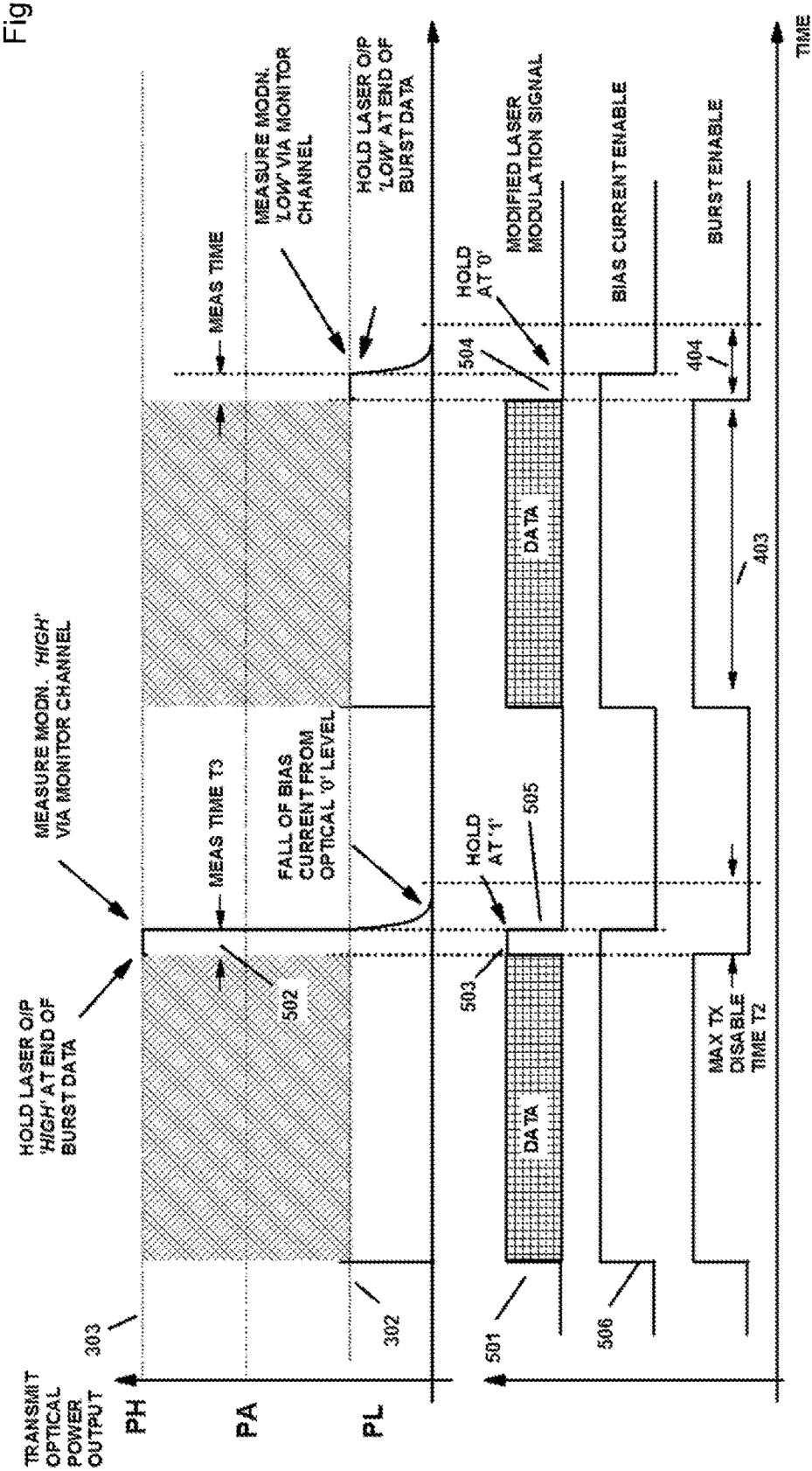
FIG. 5 shows a burst mode optical signal with high and low reference levels embedded within valid data packets.

FIG. 5 shows the optical levels associated with a burst mode system wherein subtle modifications have been made to the transmitted signal that facilitate measurements of the High and Low levels. Said modifications are made such that they do not affect the normal transfer of data within the burst packets and do not transgress the specifications set by the relevant standard.

To provide the framework for said modifications a time interval is first defined to satisfy the conditions that it is substantially less than the laser turn off time 405 allowed by the standard but long enough to be substantially longer than the settling time of the monitor channel output 105 and at the same time allows sufficient remaining time within the period 405 for the bias current control circuits to extinguish the laser completely. A feature of the example is the replacement of the raw data signal 111 with a modified form of the laser modulation signal 501 wherein at the end of each burst a known logical value is held for an extended period T3 502. At the same time, the bias current to the laser 114 is controlled by a modified version of the burst enable signal 506 such that the bias remains active for a defined period after the data for that burst has ceased. The logical value of this extension of the data burst is made to alternate between a '1' denoted 503 in FIG. 5 and a '0' denoted 504 in FIG. 5. The duration of this logical value holding period 502 is made to be sufficient for the monitor channel output 105 to be able to settle to a substantially accurate measurement result. If the logical value held at the end of the data burst is '1', then the laser modulation current 115 is returned to a '0' at the end of this extension period 502 by means of a command edge 505 to the data modulation circuitry 110. In this way, the laser current is reduced substantially towards its extinction state by means of a high bandwidth circuit function in some very short time (in this example, 10s of picoseconds), rather than by a possibly much slower bias current control. Immediately this state has been reached, the bias current 114 is turned off by the bias control signal 506 and decays to zero before the end of the time permitted by the relevant standard. By these or substantially similar means it is therefore possible for the monitor output 105 to deliver substantially accurate representations of the true prevailing optical outputs during both logical '1' and logical '0' data states, without significant restrictions arising from particular data patterns and/or run lengths as is often the case in prior art. From these measurements taken from alternate data bursts the analogue values may be converted into digital form 113 and a simple algorithm may be employed to complete a systems to determine the prevailing extinction ratio and the average optical power, and further to determine any required adjustments to the modulation current 115 and the bias current 114 such that the ER and average power correspond with the desired target values for the system.

It is advantageous that the control system so comprised measures the steady state optical values for both logical '1' and logical '0' free from significant assumptions regarding the performance of other parts of the system and substantially not derived from indirect calculations.

It is further advantageous that the intermittent nature of the burst mode signal does not detract from the operation of the control system.

Figure 6:
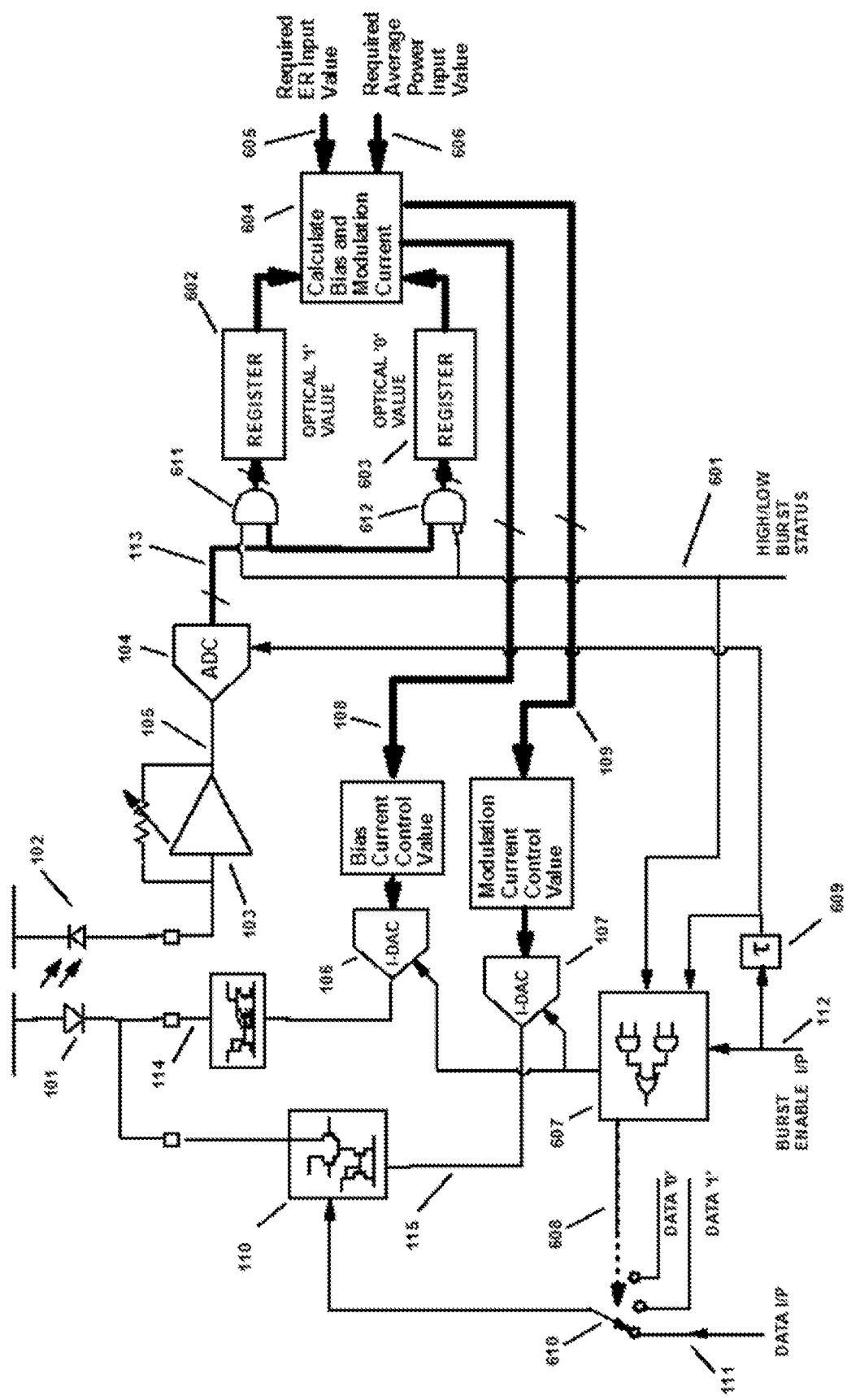
FIG. 6 shows schematically circuitry according to a first example.

FIG. 6 shows an example circuit arrangement. The bias current 114 is set by a current output digital-to-analogue converter (DAC) 106 and the modulation current 115 is similarly set by another DAC 107. The controlling digital values for said DACs are determined by a digital calculation function 604, which takes its inputs from the system feedback values and the digital inputs corresponding the desired average power 606 and modulation depth (or ER 605). The modulation circuitry 110 is no longer controlled directly by the incoming data 111 but can now have its input switched between the data 111, and logic '1' or logic '0' by means of a selector switch function 610. When the burst enable signal 112 is asserted to indicate the start of a data burst the logical control function 607 will set the modulation input path using selector 610 to pass the incoming data directly to the modulation circuitry 110. A modulated optical signal will be generated by the laser 101 and a band-limited representation of same 105 will be created by the monitor diode 102 and its associated amplifier 103. This monitor signal 105 is converted to a digital value 113 by an analogue-to-digital converter (ADC) 104. During payload of the data burst this output 113 may be used but it will be of limited value due to the bandwidth limitations of this channel. At the end of the data payload the burst enable signal will indicate the end of this transmission. In a conventional system, this would disable the modulation 115 and bias 114 currents completely.

According to this example, the control logic 607 takes a defined delay time 609 and holds the bias and modulation currents on. An additional burst status signal 601 is provided by the embodiment that changes logical value with each data burst, effectively designating bursts as "HIGH" or "LOW". As an example embodiment, if the burst is designated as "HIGH" then during the delay at the end of the burst, the modulation input selector 610 is set to a logical '1' 503 such that the optical output is held at the high level 303. This modulation optical value is held for a time period 502 long enough for the monitor channel to make an accurate measurement despite its limited bandwidth; but still short enough that there is time to fully extinguish the laser. The monitor channel output 105 is converted to digital form 113 and then passed at a suitable time instant to a first register 602 via a logical gate 611 enabled by the burst status signal 601. This register then provides the measured optical high value to the calculation function 604.

At the end of this delay period 503 the modulation selector is set to a logical '0' to remove the laser modulation current 115 using the normal modulation circuitry and hence reduce the optical output very rapidly. At the same instant 505, the control logic 607 commands the bias current DAC 106 and the modulation current DAC 107 to cease outputting current, such that the laser 101 becomes completely extinguished within the period 404 required by the relevant communication standard.

If the burst is designated as "LOW" by the burst status signal 601 then at the end of the data payload the modulation selector 610 is set to a logical '0' 504 such that the laser output is at the low level 302. Even if the last symbol in the burst data payload required a logical '1' at the end of the burst, then the transition to a logical '0' can be effected with great speed by using the normal modulation circuitry 110. Again, this modulation optical value is held for a time period 502 long enough for the monitor channel to make an accurate measurement despite its limited bandwidth; but still short enough that there is time to fully extinguish the laser.

The monitor channel output 105 is then converted to digital form 113 and then passed at a suitable time instant to a second register 603 via a logical gate 612 enabled by the logical complement of the burst status signal 601. This register then provides the measured optical low value to the calculation function 604.

It will be obvious that a convenient and efficient arrangement will be to designate the bursts as "HIGH" and "LOW" in an alternating manner. However, the example may also employ some other sequence of "HIGH" and "LOW" states where there may be a need to obtain an estimate of one level faster than the other, or to take account of some other requirements of the system.

The calculation function 604 then takes the required target value inputs for the average 606 and ER 605 and using a simple calculation derives the new bias current control value 108 and the new modulation current value 109 such that the errors between the calculated ER and average values and the corresponding required ER and average values are minimised and brought to a negligible or acceptable level. This process may take several iterations of "HIGH" and "LOW" bursts and the precise rate of convergence of the system will depend on coefficients and scale factors chosen for a particular application.

Figure 7:
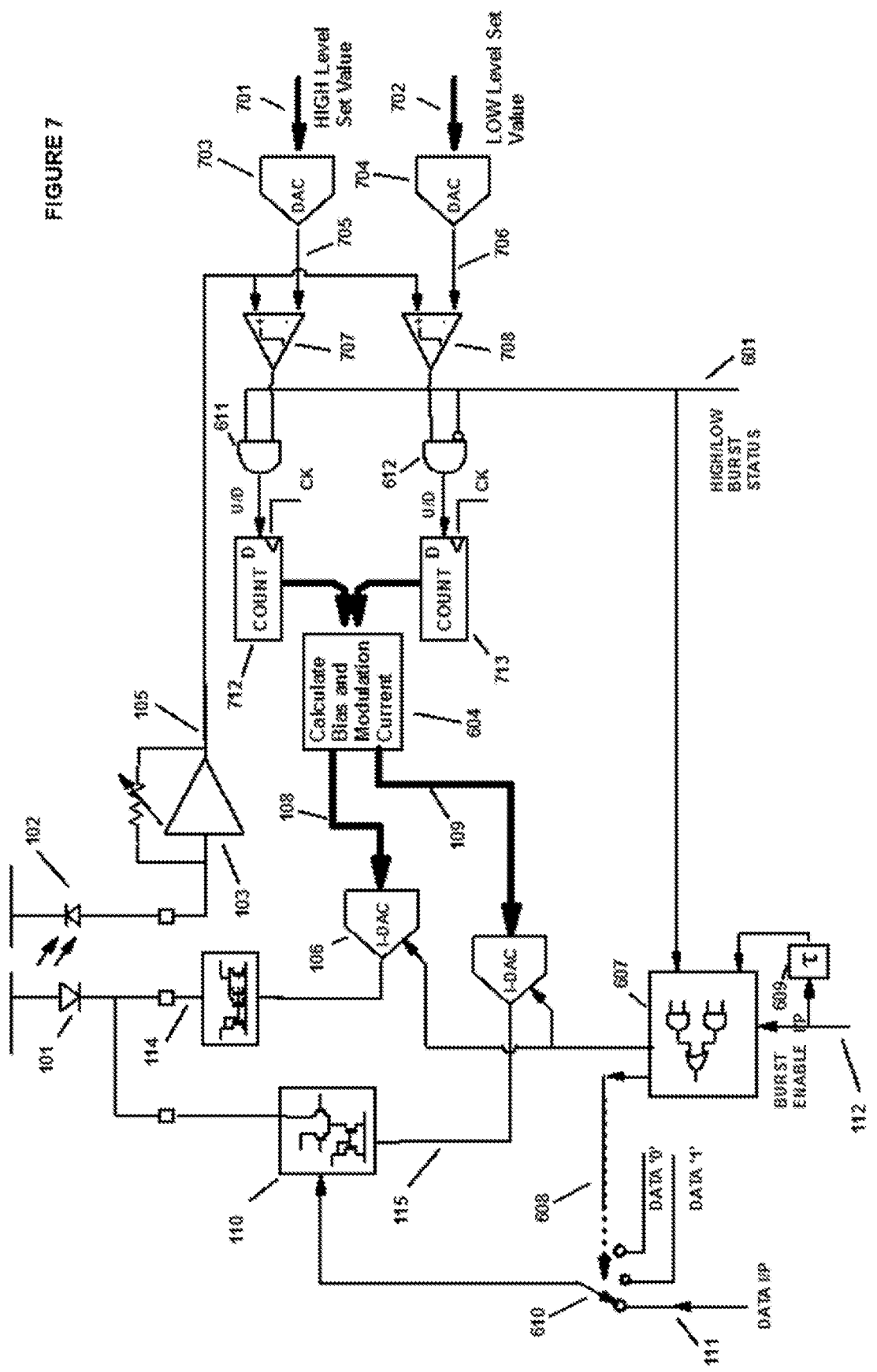
FIG. 7 shows schematically further circuitry according to a further example.

FIG. 7 shows an arrangement according to a second example. In this arrangement, the derivation of the corrections to the bias and modulation currents are performed with more analogue processing. The laser modulation and monitor circuits are substantially as in the previous arrangement according to FIG. 6. Instead of converting the output of the monitor channel 105 into digital form, the analogue value is compared directly with another analogue value derived from reference analogue values generated by DACs from user defined input values. The operation is as follows:

The desired optical high value 701 and desired optical low value 702 are supplied from the user in explicit form and used to control two DACs 703 and 704 respectively. The outputs 705 and 706 of these DACs are equivalent to the desired monitor photodiode amplifier 105 outputs for optical '1' and optical '0' under ideal optical bias conditions and desired modulation value. A person skilled in the art will also immediately recognise that the desired operating current may also be supplied as an average value and an ER value, and then converted to equivalent high and low values by means of simple arithmetic circuits.

It will be obvious to one skilled in the art that the voltages 105 and 705 should be substantially identical with the laser is operating in the logical high state under ideal conditions. Similarly it will be obvious that the voltages 105 and 706 should be substantially identical when the laser is operating in the logical low state under ideal conditions. The comparators 703 and 704 are used to determine the sign of any difference between the indicated levels and the desired levels.

When the data burst is designated "HIGH", then at the end of the holding period 502 the comparator 707 output is passed via logic gate 611 controlled by the burst status signal 601 to a counter 712 wherein it is used to control a counting process either up or down, depending on the sign of the output of the comparator 707. If the monitor signal 105 is less than the reference signal 705 from the DAC 703 at this instant, then the counter will decrement indicating a negative error for the high optical state. If the monitor signal 105 is greater than the reference signal 705 then the counter 712 will increment.

Similarly, when a data burst is designated as "LOW" then at the end of the holding period 502 then the comparator 708 output is passed via logic gate 612 controlled by the complement of the burst status signal 601 to a counter 713 wherein it is used to control a similar counting process either up or down, depending on the sign of the output of the comparator 708. If the monitor signal 105 is less than the reference signal 706 from the DAC 704 at this instant, then the counter will decrement indicating a negative error for the low optical state. A corresponding increment will take place if the monitor output is higher than the replica at this instant.

From the values from the counters 712 and 713 at any given time the logical arithmetic block 604 can easily calculate the bias control value 108 and the modulation value 109 needed to correct the error observed between the monitor output 105 and the replica path 710. Over a number of data bursts it will be obvious that the system will adjust the currents so that the errors are minimised, and hence the laser will be operating at substantially the desired average optical output and with substantially the desired ER.

Figure 8:
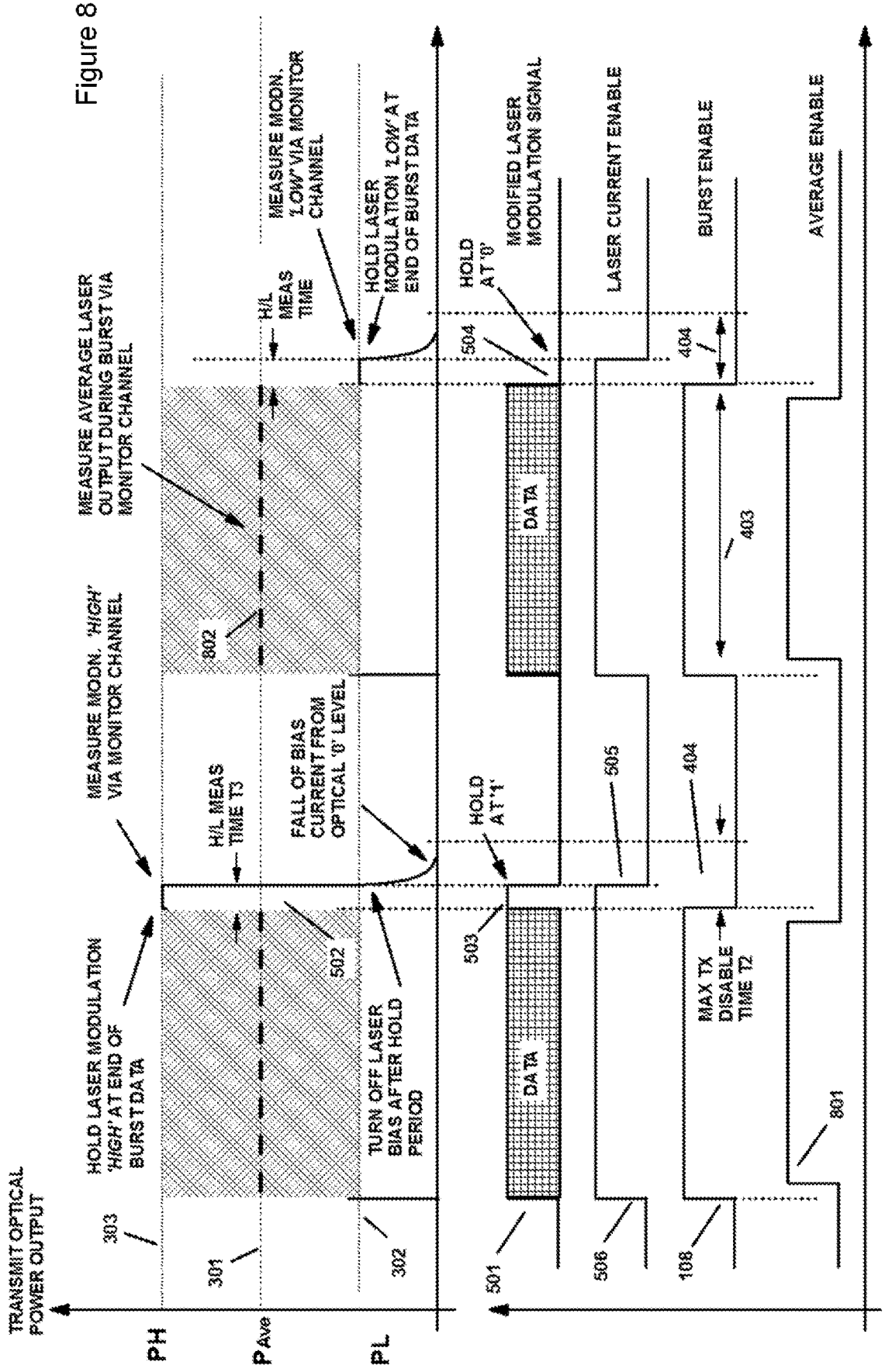
FIG. 8 shows a burst mode optical signal with high and low reference levels embedded within valid data packets and an average value derived during the valid data packets.

FIG. 8 shows the optical levels associated with a burst mode system including the modifications made to the transmitted signal in terms of the short extension periods that facilitate measurements of the '1' and '0' levels as previously described in relation to FIG. 5 of this application. In addition to the operations intended to estimate the optical output '1' level and optical output '0' level, the average value of the monitor channel output during the period that data is being transmitted 802 is determined. During intervals between each data burst the average value so determined is held until the beginning of the next burst of data, and at the said beginning of the next burst, the averaging operation can resume. A gating signal 801 may be used to enable the averaging operation, wherein said gating signal 801 corresponds to the time during which data is being transmitted, but not including the extension period 504 or the time allowed for the laser to turn off 404. This averaging may be a cumulative average but may also be a weighted average wherein the most recent signal has a stronger weighting, and older values from previous bursts of data may be progressively discounted. Note that if this gating of the averaging operation by a control signal 801 or similar means were not done, and a continuous averaging function used, the average level would clearly also depend on the OFF time between each data burst, and the frequency with which groups of bursts are to be transmitted. Clearly, such a continuous averaging function would fail to provide useful information for a system controlling the laser's optical output power.

Figure 9:
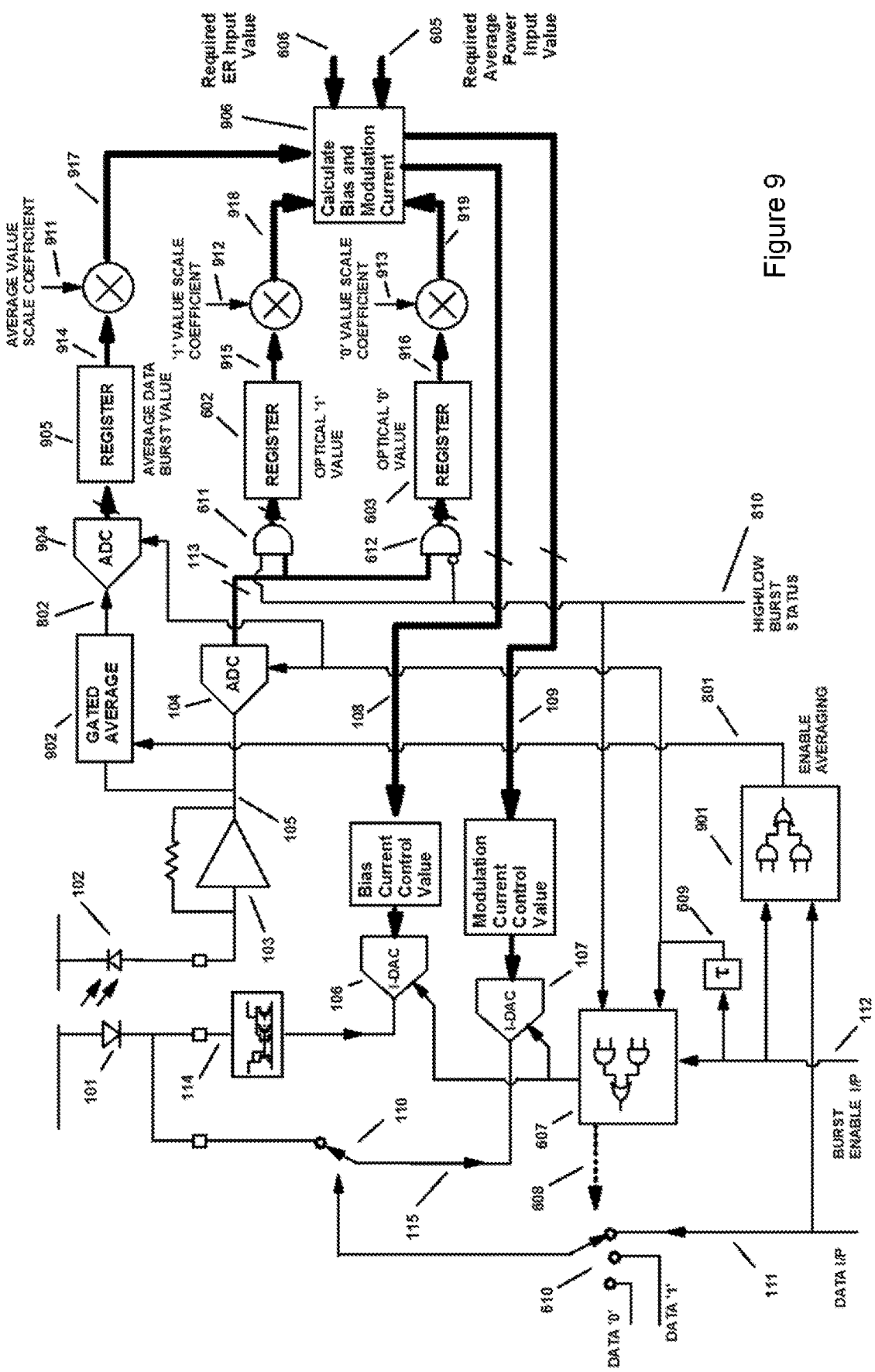
FIG. 9 shows schematically circuitry according to some embodiments.

FIG. 9 shows an arrangement according to another embodiment of the invention. In this embodiment a measure 915 of the optical output of the laser corresponding to a logic '1' and a measure 916 of the optical output of the laser corresponding to a logic '0' are obtained using the same techniques as described heretofore with reference to FIG. 6. The monitor channel output 105 is also sensed by averaging circuitry 902 during time intervals entirely within the burst periods when data is being transmitted. Logic circuitry 901 takes as inputs the data input 111 and the burst enable input 112 and generates a gating signal 801 which enables the averaging function and dictates the time period during which the averaging function is to take place. Said gating signal 801 is configured to become active only after the expected settling time of the monitor channel output resulting from the start of the data burst and as a result of the restricted bandwidth of the monitor channel. This requirement for a delay from the start of the burst enable signal is typically of the order of several data symbol periods. When the average enable gating signal 801 is not valid, the averaging circuitry 904 inhibits the input 105 from the monitor channel and holds the present value of the average 802. The averaging process performed by the averaging circuitry 902 may take account in each calculation of previous average values and may use weighting or decay rates that are defined to optimise the response time and the noise immunity, as would be common practice by persons skilled in the art when employing such functions. Other averaging algorithms may also be employed in other embodiments depending on particular circumstances. The average value may in one embodiment be held in a temporary storage register 905 in a similar way to the holding of the logical '1' and logical '0' measures held in registers 602 and 603.

Because of the non-linearity of the characteristic of the laser optical output versus the applied current, combining the logical '1', logical '0' and average value together in a simplistic arithmetic way does not produce a consistent control strategy for the laser bias and modulation currents, since the true average will not be the arithmetic mean of the logical '1' and logical '0' levels. Further, depending on the particular application and embodiment, certain features of the laser output may be given priority over others. For example, it may be essential to maintain the laser current above the lasing threshold current when the output is required to be in the logical '0' state, where the sensitivity to errors in the measures used for the control is most severe. There may also be more noise and/or uncertainty in the measures of the logical '1', logical '0' and average depending on the specific features of a particular practical embodiment.

To provide an advantageous solution to these requirements, the measures derived from the monitor channel output 105 are scaled by separate coefficients, each coefficient being in the range from '0' to '1' prior to their use in a calculation function intended to produce control signals for the laser currents. The measure of the logical '1' level 915 is scaled by coefficient 912, the measure of the logical '0' level 916 is scaled by coefficient 913, and the measure of the average level of the burst levels 914 is scaled by coefficient 911. The values of these scaling coefficients may be set depending on the achieved signal quality obtained from each channel in the practical application and on the priorities for the features of the laser's optical output waveform. The numerical values for these scaling coefficients may be fixed or variable. For example the coefficients may be determined at the time of manufacture and testing and stored in the system. Alternatively, the user may determine the numerical values for the coefficients during testing or as a result of monitoring extended operation, and from these observations be able to optimise the values and then store them in the system. As another alternative, a controller function may be constructed with the capability to vary the coefficients while the system is in use in an adaptive manner using other performance information, possibly starting from some defined starting values.

The scaled measure of the logical '1' level 918, the scaled measure of the optical '0' level 919 and the scaled measure of the burst average level 917 are fed to a calculation function 906. A user specified input signal 606 representing the desired optical modulation level and a user specified input signal 605 representing the desired average power level are also fed to the calculation function 906. The calculation function 906 performs a calculation algorithm on the aforementioned inputs and provides a control signal 108 to control the laser bias current 114 and a control signal 109 to control the modulation current 115. The precise form of the calculation algorithm may be different depending on the desired behaviour of the complete laser driver system, for example, in terms of the monitor channel performance and/or the characteristics of the laser, but not limited to these examples. The calculation will in some embodiments be optimised to control the laser bias 114 and modulation current 115 such that the logical '1' optical output level, the logical '0' optical output level and the average of the optical power during a burst settle to the desired values during the operation of the communications system.

Figure 10:
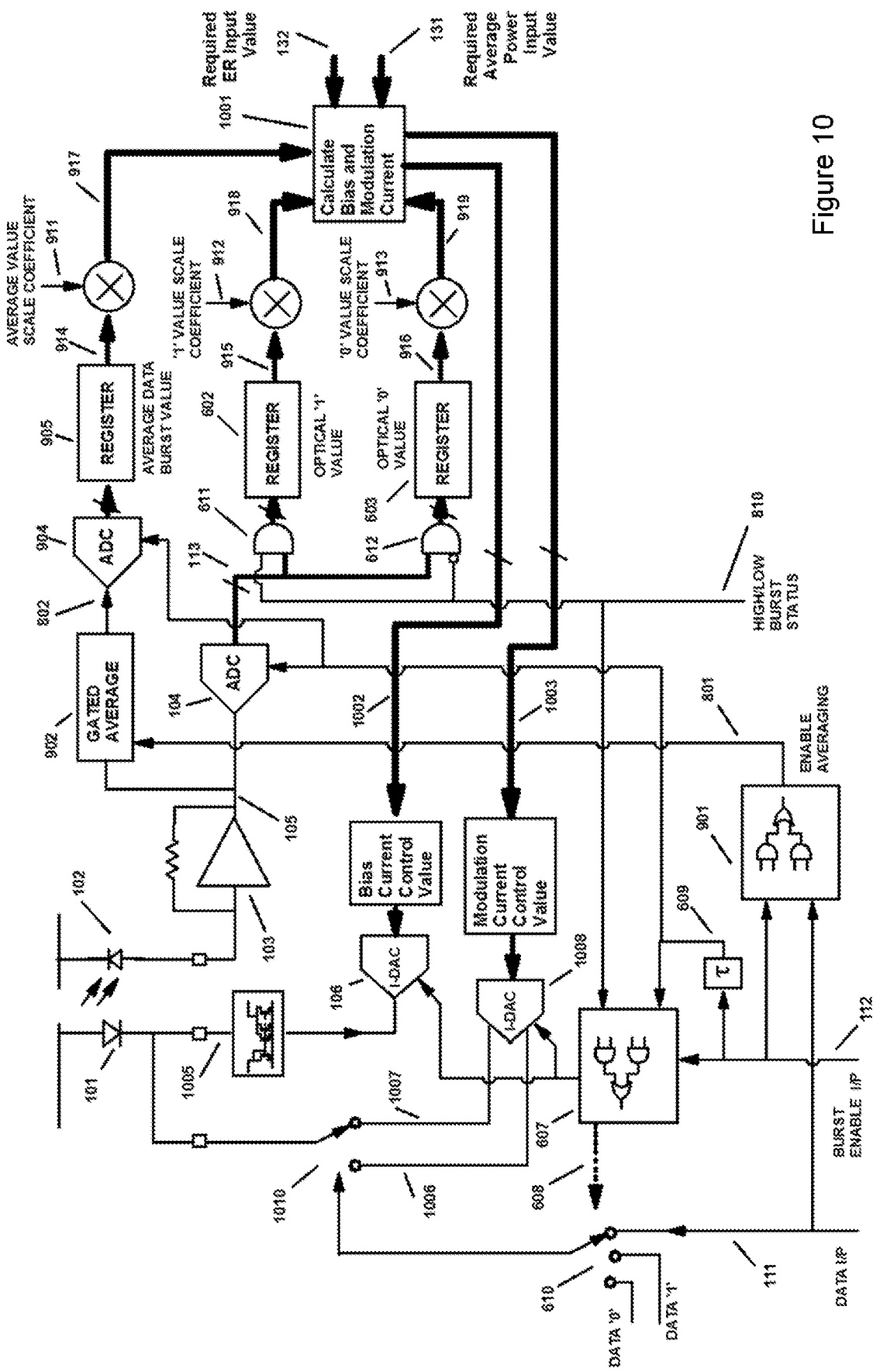
FIG. 10 shows schematically further circuitry according to some further embodiments.

FIG. 10 shows an arrangement according to another embodiment of the invention, wherein the means for obtaining measures of the optical levels are substantially as described in relation to the embodiment shown in FIG. 9. In the arrangement shown in FIG. 10, the calculation function 1001 takes as inputs the scaled measure 918 for the optical logical '1' and the scaled measure 919 for the optical logical '1' and the scaled measure 917 for the optical average during the data bursts and also takes the required target value inputs for the average 131 and ER 132 and uses an algorithm whose characteristics are similar to those described for the calculation function 906 as described with reference to FIG. 9 to generate a control signal 1002 controlling a DAC 106 to generate an average current 1005 in the laser diode and also to generate a control signal 1003 to control a differential output DAC 1008 to generate two equal currents 1006 and 1007 having opposite senses which may be switched by the modulation switch 1010 so as to add or subtract current from the average current 1005 thereby imposing the desired modulation of the laser's total current. The calculation will in some embodiments be optimised to control the laser's average current 1005 and modulation currents 1006 and 1007 such that the logical '1' optical output level, the logical '0' optical output level and the average of the optical power during a burst settle to the desired values during the operation of the communications system.

Figure 11:
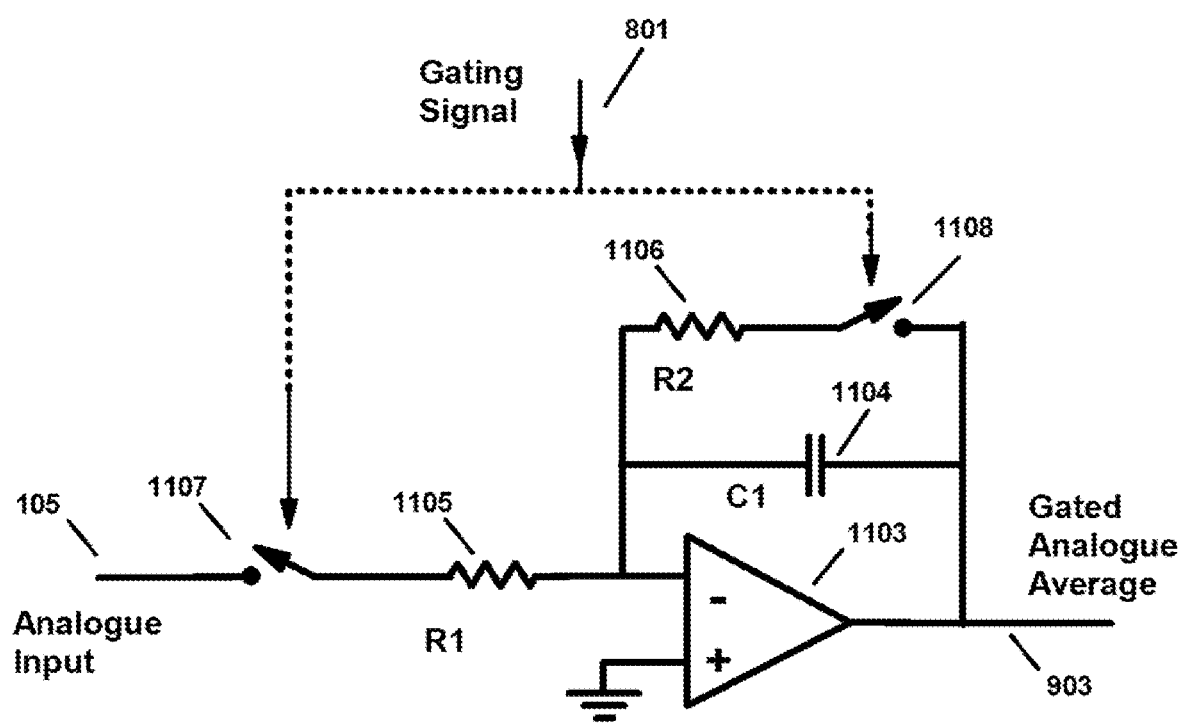
FIG. 11 shows schematically additional circuitry according to additional embodiments.

FIG. 11 shows an embodiment of a simple means of obtaining a gated average value from an analogue input signal 105. Said analogue input signal 105 is passed to an analogue integrator comprising amplifier 1103, resistor 1105 and capacitor 1104 via a switching function 1107 under the control of a gating signal 801. While the switch 1107 is closed the output 1102 of the integrating amplifier 1103 will rise or fall depending on the instantaneous sign and magnitude of the input signal 1101. When the switch 1107 is opened under the control of the gating signal 801 the integration and averaging operation will cease and the value will be held. Any drift in the output value will be due to electrical imperfections in the components used. It may be desirable to have some decaying function for the averaging operation. A simple and convenient method illustrated is to connect a resistance 1106 across the capacitance 1104 by means of switch 1108 that allows the integrated value to decay during the duration of the data burst as controlled by the gating signal 801 at some rate set by the relative values of these components.

Over a number of data bursts, the complete system will adjust the currents so that the errors are minimised, and hence the laser will be operating at substantially the desired average optical output and with substantially the desired ER.

Whilst this invention has been described with reference to particular examples and possible embodiments thereof these should not be interpreted as restricting the scope of the invention in any way. It is to be made clear that many other possible embodiments, modifications and improvements may be incorporated into or with the invention without departing from the scope and spirit of the invention as set out in the claims.

The invention claimed is:

1. A system for transmitting a sequence of at least two data bursts in a fibre optical communications system, the system comprising:
    selection circuitry configured to select one of a data input value, a logical high value or a logical low value such that the selection circuitry selects the data input value during a data transmission period during a defined burst period and selects one of the logical high value and the logical low value during an extension time period during the defined burst period and immediately following the data transmission period, such that for the sequence of at least two bursts, at least one burst has a logical low value extension period and at least one burst has a logical high value extension period;
    drive circuitry configured to apply a current to a laser diode, the current corresponding to the value selected by the selection circuitry during the defined burst period or a zero value otherwise, the current being such that the laser diode is configured to provide an optical output;
    an optical sensor module configured to provide a sensor module output corresponding to the optical output of the laser diode; wherein the sensor module output is configured to provide electrical outputs proportional to the optical output of the laser diode corresponding to the logical high value and the logical low value in the sequence of at least two bursts; and further configured to provide an output corresponding to an average value of the sensor module output during only the data transmission period during the sequence of bursts; and
    a controller configured to receive desired values regarding optical signaling output power levels of the laser diode and to receive the output from the optical sensor module proportional to the optical output power level corresponding to the logical high value and the logical low value and to receive the output corresponding to the average value of the sensor module output during only the data transmission period during the sequence of bursts; wherein the controller is configured to use a combination of the average and high and low values of the outputs from the optical sensor module wherein each value is scaled by a coefficient to provide control values for the drive circuitry.

2. A system as claimed in claim 1, wherein the optical sensor module comprises a photodiode output power detector.

3. A system as claimed in claim 1, wherein the optical sensor module comprises an optical sensor and a trans-impedance amplifier, the trans-impedance amplifier being configured to provide the sensor module output.

4. A system as claimed in claim 1, wherein the control values are configured to control at least one of:
    an average power of the optical output of the laser diode;
    a power of the optical output of the laser diode representing a logical high;
    a power of the optical output of the laser diode representing a logical low; and
    a modulation index of the optical output of the laser diode.

5. A system as claimed in claim 1, wherein the current comprises a steady element and a variable element.

6. A system as claimed in claim 1, wherein the drive circuitry is configured to set the current applied to the laser diode dependent on a combination of a bias control value and a modulation control value.

7. A system as claimed in claim 6, wherein the control values are configured to control the drive circuitry to set the at least one of: a bias current and a modulation current applied to the laser diode.

8. A system as claimed in claim 1, wherein the drive circuitry comprises bias circuitry configured to provide a bias current to the laser diode.

9. A system as claimed in claim 1, wherein the drive circuitry comprises modulation circuitry configured to provide a modulation current to the laser diode.

10. A system as claimed in claim 1, wherein the drive circuitry is configured to set the current applied to the laser diode dependent on a combination of an average value and a modulation value.

11. A system as claimed in claim 1, wherein the burst period is gated by a burst enable signal.

12. A system as claimed in claim 1, wherein the control values control the drive circuitry to deliver the optical output desired values regarding desired minimum and maximum optical output power levels.

13. A system as claimed in claim 1, wherein the extension time period is greater than a settling time of the sensor module output.

14. A system as claimed in claim 1, wherein the selection circuitry is configured to alternately select one of the logical high value and logical low value for each consecutive extension time period.

15. A system as claimed in claim 1 wherein the selection circuitry is configured to select the logical high value or the logical low value for each consecutive extension time period according to a pre-defined sequence.

16. A system as claimed in claim 1 wherein the selection circuitry comprises a selector switch function.

17. A system as claimed in claim 1 wherein the bandwidth of the selection circuitry is configured to switch between the data input, the logical high value and the logical low value in a time significantly less than that of the extension time period.

18. A method for transmitting a sequence of at least two data bursts in a fibre optical communications system, the method comprising:
    selecting one of a data input value, a logical high value or a logical low value wherein selecting comprises selecting the data input value during a data transmission period during a defined burst period and one of the logical high value and the logical low value during an extension time period during the defined burst period and immediately following the data transmission period, such that for the sequence of at least two data bursts, at least one data burst is a logical low value burst and at least one data burst is a logical high value burst;
    applying a current to a laser diode, the current corresponding to the one of a data input value, a logical high value or a logically low value selected during the defined burst period or a zero value otherwise, the current being such that the laser diode is configured to provide an optical output;
    providing an output corresponding to the optical output of the laser diode, wherein providing the output corresponding to the optical output of the laser diode comprises providing electrical outputs proportional to the optical outputs of the laser diode corresponding to the logical high value and the logical low value in the sequence of bursts and providing an output corresponding to an average value of output corresponding to the optical output of the laser diode during only the data transmission period during the sequence of bursts;

receiving desired values regarding desired optical signaling output power levels of the laser diode; and combining the average and high and low values of the outputs corresponding to the optical outputs of the laser diode wherein each value is scaled by a coefficient and the desired values regarding optical signaling output power levels of the laser diode and using these combined values to provide control values to control the applying a current applied to a laser diode.

19. A method as claimed in claim 18, further comprising applying the control values to control at least one of:

an average power of the optical output of the laser diode;

a power of the optical output of the laser diode representing a logical high;

a power of the optical output of the laser diode representing a logical low; and a modulation index of the optical output of the laser diode.

\* \* \* \* \*